(12) United States Patent
Imai

(10) Patent No.: US 6,477,327 B1
(45) Date of Patent: Nov. 5, 2002

(54) CAMERA HAVING IMAGE PICK-UP DEVICE

(75) Inventor: Yuji Imai, Higashiyamato (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/562,392

(22) Filed: May 1, 2000

(30) Foreign Application Priority Data

May 6, 1999 (JP) .......................................... 11-125911

(51) Int. Cl.[7] .......................... G03B 13/18; G03B 7/099
(52) U.S. Cl. ........................ 396/89; 396/113; 396/114; 250/201.8
(58) Field of Search .......................... 396/89, 113, 114, 396/121; 250/201.7, 201.8

(56) References Cited

U.S. PATENT DOCUMENTS 5,321,248 A * 6/1994 Sensui ..................... 250/201.8
5,678,097 A * 10/1997 Suda ......................... 396/113

FOREIGN PATENT DOCUMENTS

JP 07-281080 10/1995
JP 07-281271 10/1995

* cited by examiner

Primary Examiner—Russell Adams
Assistant Examiner—Arthur A Smith
(74) Attorney, Agent, or Firm—Frishauf, Holtz, Goodman & Chick, P.C.

(57) ABSTRACT

A camera includes a finder for enabling an image which is shot on a film to be monitor-displayed by branching a portion of a light beam (image) imaged by a picture-taking lens system, by an up/down movable pellicle mirror comprised of a half mirror, to let the image be received on a image pick-up device. In this camera, a pupil-dividing LCD is arranged in front of the image pick-up device to impart a phase difference to the light beam imaged by the picture-taking lens system to obtain corresponding image data. By doing so, phase difference AF control is carried out. The image pick-up device has both the function of monitoring a pick-up image and the function of detecting a just-in-focus state.

24 Claims, 11 Drawing Sheets

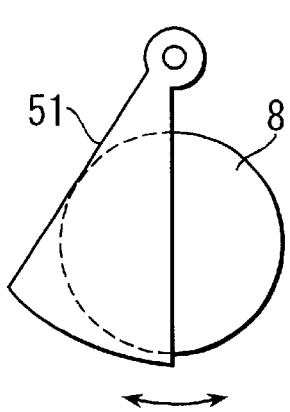
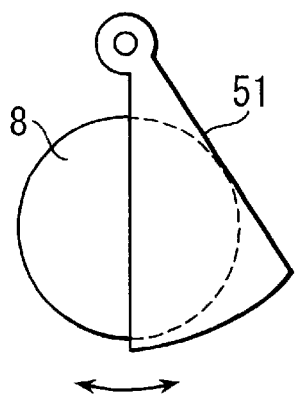
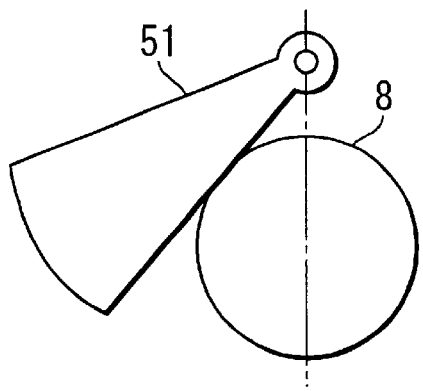
FIG. 13A   FIG. 13B   FIG. 13C
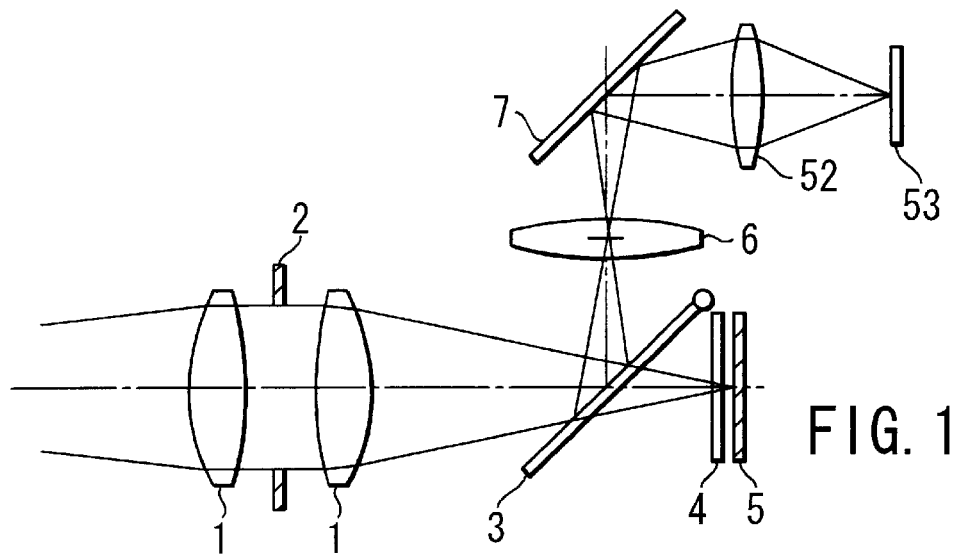
FIG. 14A
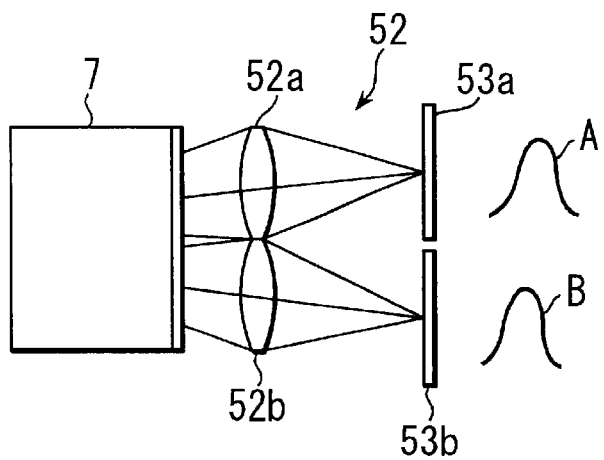
FIG. 14B

CAMERA HAVING IMAGE PICK-UP DEVICE

CROSS-REFERENCE TO RELATED APPLICATIONS

This application is based upon and claims the benefit of priority from the prior Japanese Patent Application No. 11-125911, filed May 6, 1999, the entire contents of which are incorporated herein by reference.

BACKGROUND OF THE INVENTION

The present invention relates to a (film) camera with an image pick-up device mounted thereon and, in particular, the camera which effects a high-speed and wide-scope auto-focusing (AF) detection using an image pick-up area of an image pick-up device.

Usually, the camera for taking a picture with the use of a film was not able to confirm a taken picture at a site or field because it has to be developed and printed.

Therefore, a camera has been proposed as set out below. That is, an image pick-up element, such as a CCD, is mounted in the camera body and a portion of a light beam directed toward the film at a time of taking a picture is branched to allow it to be received on the image pick-up device. In this way, an image is picked up by the image pick-up device at substantially the same time as at a light exposure time and a corresponding image equivalent to a picture taken on the film is stored and reproduced at that place, so that it is possible to confirm the taken picture as substantially the same image as that taken onto the film.

In these types of cameras, for example, JPN PAT APPLN KOKAI PUBLICATION NO. 7-281271 has proposed the technique of performing a contrast AF by using, as an AF control sensor, an image pick-up device mounted for the confirmation of a taken image.

Further, in this technique, it is possible to display, on a monitor, not only the taken image but also fit/unfit focus states when it is used to control the light exposure amount and AF and, by dividing an image displayed on the monitor into a plurality of areas, display a fit/unfit state at each area by a color display method for example.

Further, JPN PAT APPLN KOKAI PUBLICATION NO. 7-281080 discloses the technique for realizing a phase difference AF by providing two range-finding light receiving areas near a light receiving element area for a monitor of an image pick-up device provided within a finder and detecting a phase difference signal of a subject image.

In the technique of the JPN PAT APPLN KOKAI PUBLICATION NO. 7-281271, hill climbing control has been adopted for contrast AF. This hill climbing control presents a problem that it is hard to set a focus against a fast-moving subject. As a result, an out-of-focus state occurs against the fast-moving subject or there is a risk that no proper shutter release moment will be obtained.

For the phase difference AF of the PUBLICATION NO. 7-281080, a light receiving element area for monitoring the image pick-up surface and light receiving element area for detecting the AF area individually provided on a light receiving light surface of the image pick-up device and the size of the image pick-up device becomes greater. If, therefore, a detection area is to be made broader so as to enhance the accuracy of the AF control, then the light receiving surface has to be made larger and the image pick-up device becomes larger. Thus, there is some restriction.

Since, further, a light beam from a picture-taking lens system is usually branched by a half-mirror so as to take an image onto the image pick-up device, an amount of light reaching the film is reduced to a half level and, at a time of taking a picture, the substantial sensitivity of the film becomes lower and the shutter speed for a proper light exposure is slowed, so that camera shaking is liable to occur.

BRIEF SUMMARY OF THE INVENTION

The object of the present invention is to provide an AF-controlled camera which includes an image pick-up device and display monitor capable of confirming an image equivalent to a film-shot image just after the taking of a picture, detects a phase difference over a wider area with the use of the image pick-up device for AF control, and can attain an accurate, fast-speed focus setting without increasing the size of the image pick-up device.

The present invention provides a camera capable of forming a subject image onto a film with a light exposure and picking up the subject image by an image pick-up device and including: a picture-taking optical system for forming a subject image onto a film surface, a reflection mirror for reflecting at least a portion of a subject light beam passing through the picture-taking optical system, a re-imaging optical system for allowing the light beam which is reflected on the reflection mirror to be re-imaged on a light receiving area of the image pick-up device, a liquid crystal shutter provided between the re-imaging optical system and the image pick-up device and allowing the subject light beam which passes through the re-imaging optical system to be pupil-divided, the liquid crystal shutter having a first light transmissive state in which a light beam of a first area of the re-imaging optical system is passed and a second light transmissive state in which a light beam of a second area of the re-imaging optical system different from the first area is passed, a liquid crystal control circuit for setting the liquid crystal shutter at different timing to the first and second light transmissive states, and an electric circuit for outputting a signal relating to a focus state of the picture-taking optical system by a phase difference system on the basis of an image pick-up device output in a first light transmissive state and an image pick-up device output in a second light transmissive state.

Further, the present invention provides a camera capable of forming a subject image onto a film with a light exposure and picking up the subject image by an image pick-up device, and including: a picture-taking optical system for forming a subject image onto a film surface, a reflection mirror for reflecting at least a portion of a subject light beam passing through the picture-taking optical system, a re-imaging optical system for re-imaging the subject light beam which is reflected on the reflection mirror onto a light receiving area of the image pick-up device, a liquid crystal shutter provided between the re-imaging optical system and the image pick-up device and allowing the subject light beam which passes through the re-imaging optical system to be pupil-divided, and an electric circuit for outputting a signal relating to a focus state of the picture-taking optical system by a phase difference system on the basis of an output of a light receiving area of the image pick-up device on which the subject light beam divided by the liquid crystal shutter is re-imaged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 13A, 13B and 13C are views showing shielding states of a shield plate in a third embodiment; and FIGS. 14A and 14B are views diagrammatically showing a practical form of an optical system of a camera according to a fourth embodiment.

DETAILED DESCRIPTION OF THE INVENTION

The embodiments of the present invention will be explained in more detail below with reference to the accompanying drawing.

Figures 1A, 1B:
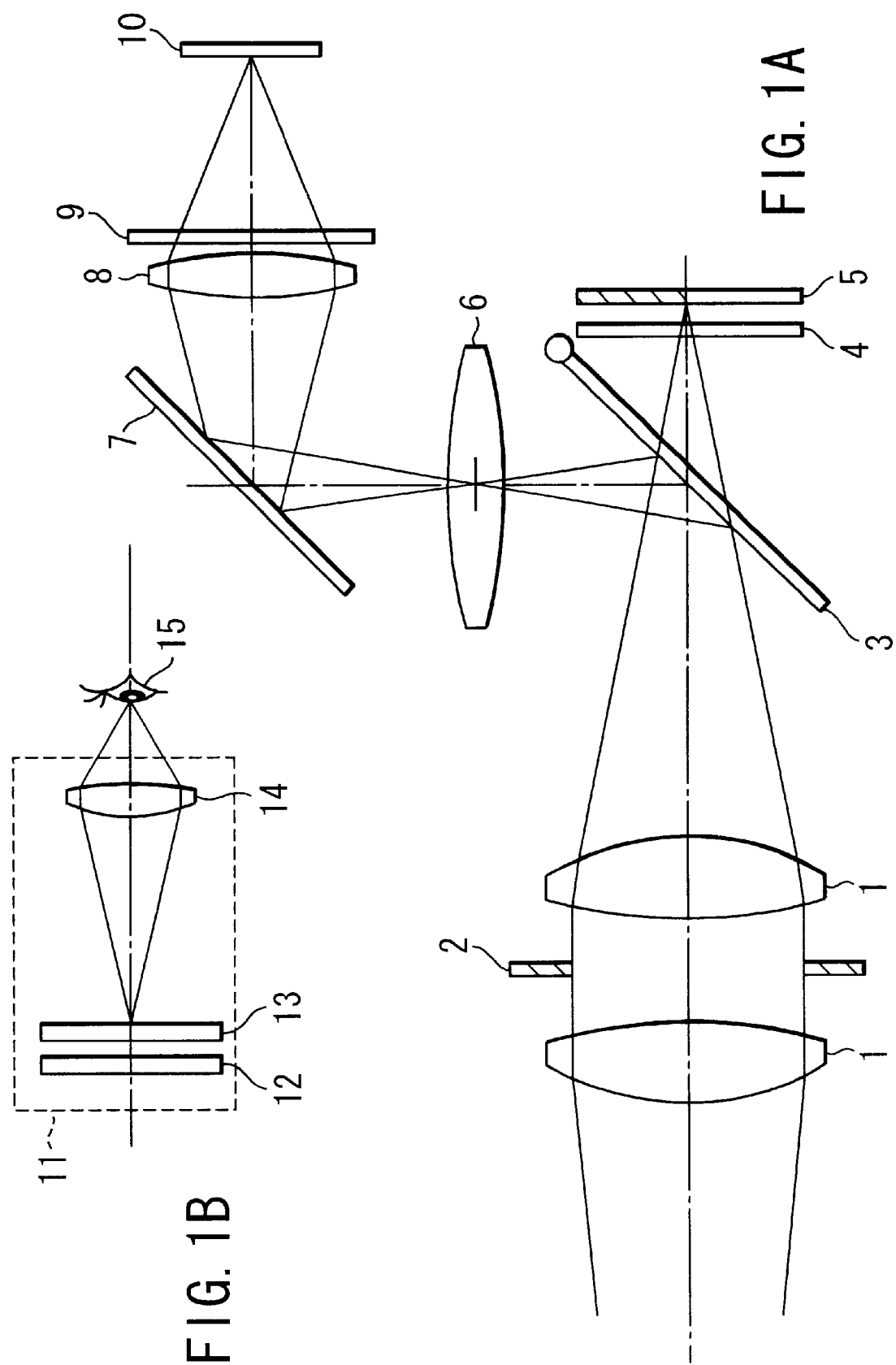
FIGS. 1A and 1B are views diagrammatically showing a practical form of an optical system of a camera according to a first embodiment.

FIGS. 1A and 1B diagrammatically showing a practical structure of an optical system of a camera according to a first embodiment of the present invention and an explanation of it will be given below.

The camera shown in FIG. 1A comprises a picture-taking lens system 1 serving as a picture-taking optical system for imaging a subject not shown, a diaphragm 2 for controlling a light exposure amount, an up-down movable pellicle mirror 3 arranged behind the picture-taking lens system 1 to allow light to be divided, a focal plane shutter (hereinafter referred to as a shutter) 4 provided near a surface of a film 5, a condenser lens 6 provided at a position substantially equivalent to the film surface, a total reflection mirror 7 for allowing those light beams which pass through the condenser lens 6 to be totally reflected, a relay lens 8 for allowing the light beam which is reflected on the total reflection mirror 7 to be re-imaged, a pupil-dividing LCD 9 composed of a liquid crystal shutter serving as a pupil dividing means (mask means) for effecting a phase difference detection, and an image pick-up device 10, such as a CCD, serving as an image pick-up means.

FIG. 1B shows a practical example of an electronic view finder (hereinbelow referred to as a finder) serving as an image pick-up means and comprising an image pick-up device 10, such as a CCD, serving as an image pick-up means and a monitor unit 11 serving as a display means for displaying a taken image. The monitor unit 11 comprises a backlight (LED) 12 for illuminating the monitor, an image monitor 13 comprised of an LCD display unit, and an eyepiece lens 14 for forming a monitor image on the eye 15 of a photographer.

The pellicle mirror 3 of the present embodiment allows an about 50% light amount to be transmitted toward a film surface side in a "down" state and about 50% light amount to be reflected toward an upper finder side.

FIG. 2 shows an example of three states assumed by the pupil-dividing LCD 9 for pupil division.

Figure 2A:
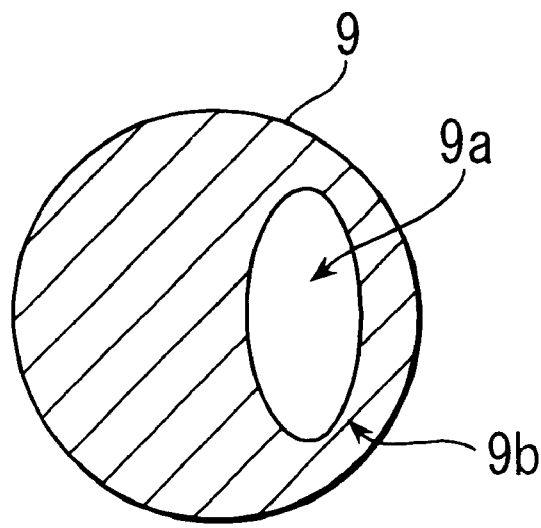
FIGS. 2A, 2B and 2C are views showing three examples of light-transmissive and light-shielding states assumed by a pupil-dividing LCD in FIG. 1.

FIG. 2A shows a transmission pattern of the pupil-dividing LCD 9 at a time of effecting phase difference auto-focusing (AF) control. In this case, an elliptical section to the right side of the pupil-dividing LCD 9 shows a transmission area 9a for allowing the transmission of the light beam and a hatched section shows a light shielding area 9b. In this pattern, the light beam to the right side of the relay lens 8 is transmitted.

Figure 2B:
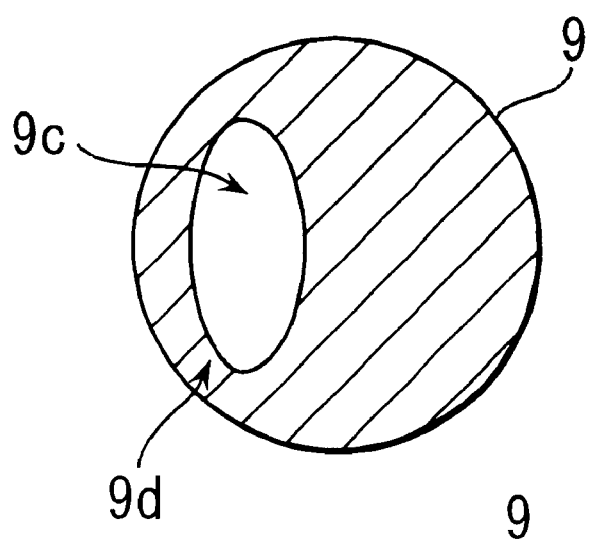

FIG. 2B similarly shows a transmission pattern of the pupil-dividing LCD 9 at a time of performing AF control. In this case, an elliptical section to the left side of the pupil-dividing LCD 9 shows a transmission area 9c for allowing the transmission of the light beam and the hatched section shows a light shielding area 9d. In this pattern, the light beam is transmitted through the left side of the relay lens 8.

Figure 2C:
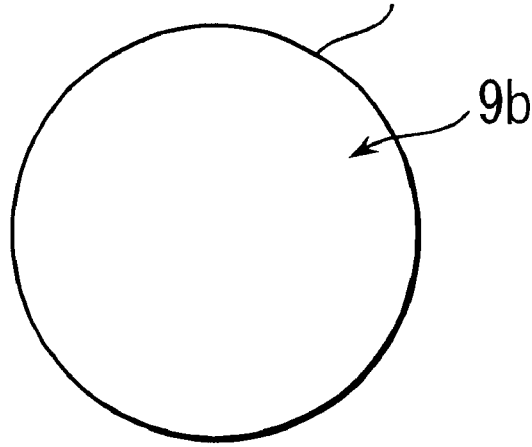

FIG. 2C shows a transmission pattern of a pupil-dividing LCD 9 in the case of being used as an electronic view finder and, in this case, the whole area is set in a transmissive state so as to display a whole picture taking image surface.

Figure 3:
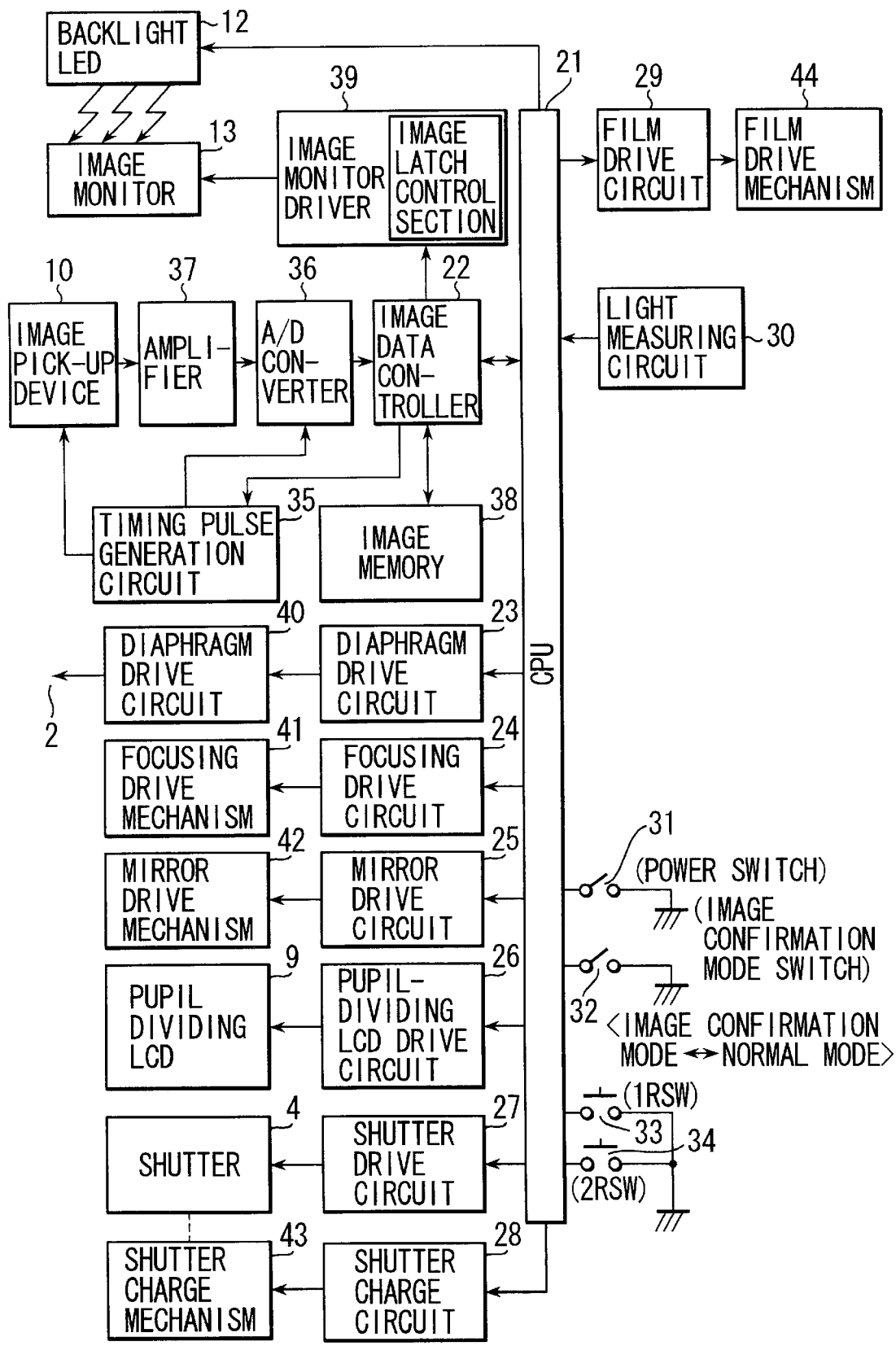
FIG. 3 shows a block diagram showing an arrangement of a system of the camera of the first embodiment.

FIG. 3 is a block diagram showing a system arrangement of the camera of the embodiment. This camera functions as a just-in-focus state detecting means and has a CPU 21 for performing sequence control of the camera as a whole.

To the CPU 21, an image data controller 22, diaphragm drive circuit 23, focusing drive circuit 24 serving as a just-in-focus state detection means, mirror drive circuit 25, pupil-dividing LCD drive circuit 26, shutter drive circuit 27, shutter charge circuit 28, film drive circuit 29, light measuring circuit 30, power switch (SW) 31 for effecting a power ON/OFF switching, image confirmation mode SW 32, 1st release SW (1RSW) 33 and 2nd release SW (2RSW) 34 are connected.

The image data controller 22 performs the drive control of peripheral circuits of an image pick-up device 10 in response to a control signal output from the CPU 21. First, the image data controller 22 controls a timing pulse generation circuit 35 to allow a timing signal to be sent to the image pick-up device 10 and A/D converter 36. An analog output signal from the image pick-up device 10 is amplified by an amplifier (AMP) 37 and A/D converted by the A/D converter 36 and, as image data, input to the image data controller 22.

Further, the image data controller 22 temporarily stores the input image data in an image memory 38. The image monitor driver 39 effects the drive control of an image monitor 13 to allow the image data which is picked up from the image pick-up device 10 or storage memory 38 to be displayed. The image monitor 13 is equipped with a backlight 12 controlled by the CPU 12.

Further, the diaphragm drive circuit 23 controls a diaphragm drive mechanism 40 to drive (stop down or open) the diaphragm 2. The focusing drive circuit 24 controls the focusing drive mechanism 41 to allow the focusing of the picture-taking lens system 1. The mirror drive circuit 25 drives a mirror drive mechanism 42 to allow the pellicle mirror 3 to be moved up or down.

And the pupil-dividing LCD drive circuit 26 drives the above-mentioned pupil-dividing LCD 9. The shutter charge circuit 28 controls a shutter charge mechanism 43 to allow spring charging in preparation for the action of the shutter. In the present embodiment, first and second curtains of the shutter 4 use the spring as a drive source and, after taking a picture, the running of the first and second curtains is completed and it is necessary to perform the charging of the spring as a drive source for the next shot. The film drive circuit 29 enables a film drive mechanism 44 to feed the film 5 for wind/rewind.

The image confirmation mode SW 32 is comprised of a switch which is set to a mode for displaying an image taken onto the film on the monitor immediately after it is shot. The switch displays the shot image on the image monitor 13 when in an ON state and is switched to a normal mode, when in an OFF state, in which the shot image is not shown. The 1RSW 33 is turned ON by a first stroke of the release button and the 2RSW 34 is turned ON by a second stroke of the same button.

A main routine of the camera in the first embodiment will be explained below with reference to a flow chart shown in FIG. 4.

First, the power SW 31 is turned ON and the camera is started. With the start of the camera, the image pick-up device 10 is driven to allow light beams (image data) imaged by the picture taking lens system 1 to be sequentially input into the image memory 38 (step Si). The image data is read out from the image memory 38 and displayed on the image monitor 13 with the backlight 12 ON (step S2).

It is decided whether the 1RSW 33 is turned ON or OFF (step S3). If, as a result of decision, the 1RSW 33 remains OFF (NO), control is returned back to step Si and, again, an image pick-up is made by the image pick-up device 10 and a corresponding image is displayed on the image monitor 13. With the 1RSW 33 OFF, subject images sequentially picked up by the image pick-up device 10 are sequentially displayed on the image monitor 13. By such a method, the image is displayed as a dynamic image on the image monitor 13.

With the 1RSW ON (YES), a just-in focus state is detected (step S4).

Figure 5:
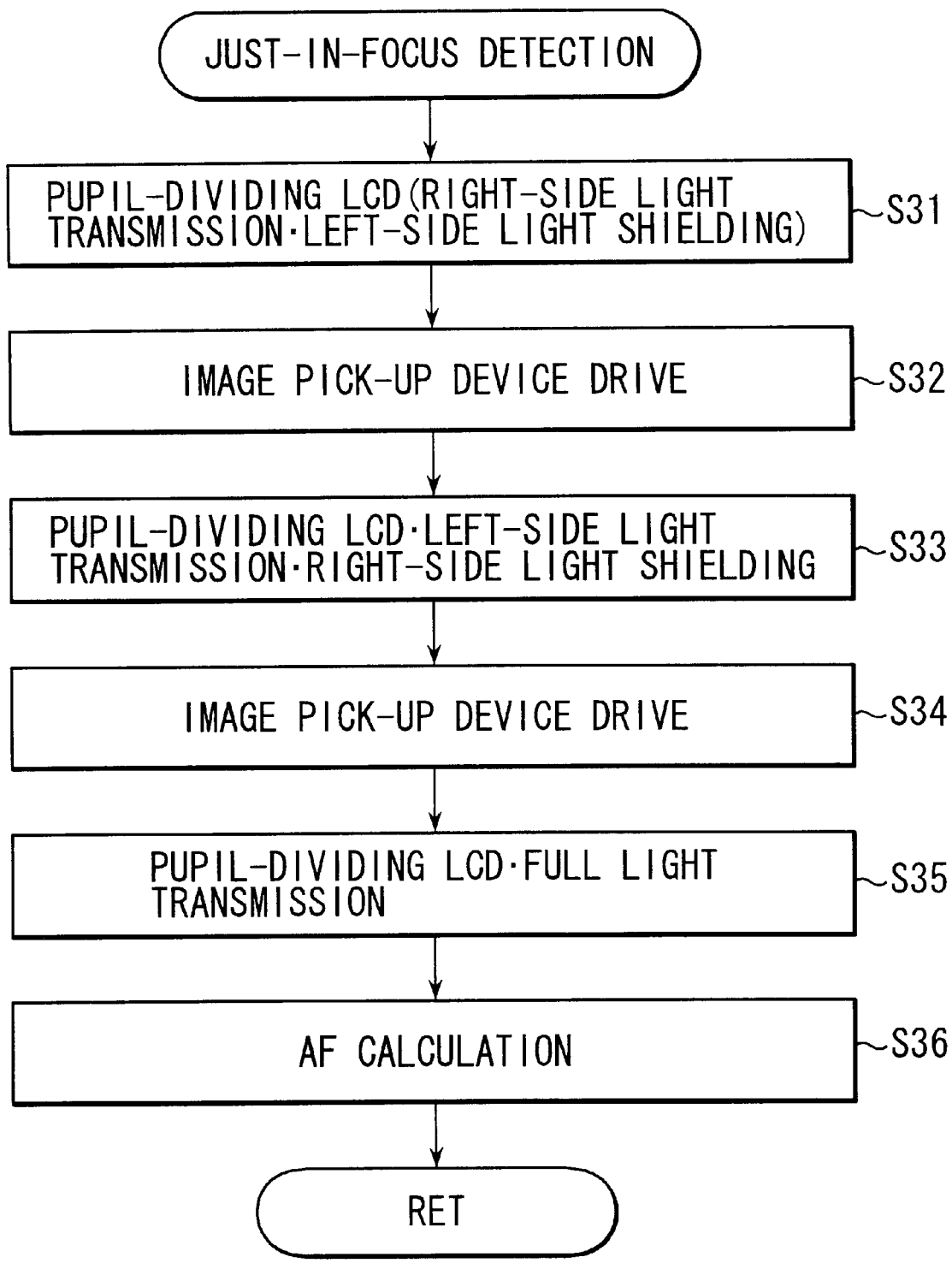
FIG. 5 is a flow chart for explaining a sub-routine of a just-in-focus detection in FIG. 4.

Here, a sub-routine of the just-in-focus detection will be explained below with reference to a flow chart shown in FIG. 5.

First, the pupil-dividing LCD 9 is set with a light transmission area formed to the right side and a light shielding state formed to the left side as shown in FIG. 2A (step S31).

And the image pick-up device 10 is driven to allow image data to be picked up under the CPU 21 (step S32).

Then, the pupil-dividing LCD 9 is set with a light transmission area switched to the left side and a light shielding state to the right side (step S33). And the image pick-up device 10 is driven to allow image data to be picked up under the CPU 21 (step S34). After such image pick-up has been effected, the pupil-dividing LCD 9 is so set that the whole area of the LCD is in a light-transmissive state as shown in FIG. 2C (step S35). Based on the image data picked up from the right and left sides of the pupil-dividing LCD 9 a correlation calculation of the phase difference AF is carried out by a predetermined algorithm to select a main subject position and find defocus amount in the main subject position (step S36) and control is returned back. It is to be noted that the image data from the pupil-dividing LCD 9 may be taken first from either of the right and left side.

Figure 4:
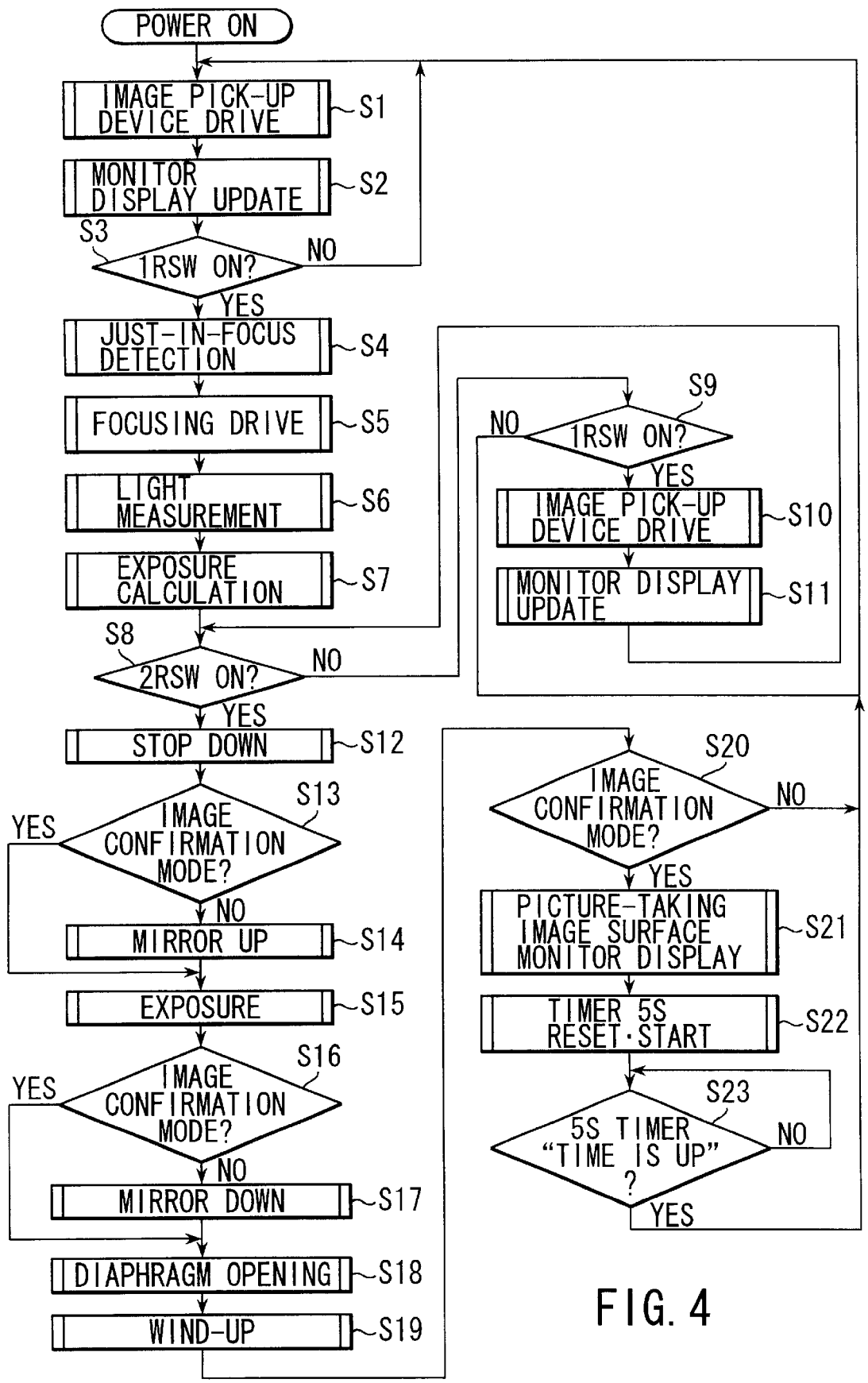
FIG. 4 is a flow chart for explaining a main routine of the camera according to the first embodiment.

Then control is returned back to the main routine of FIG. 4.

In accordance with a defocus amount obtained at step S4 the picture-taking lens system 1 is adjusted and focusing drive is effected (step S5). After obtaining a just-in-focus state, the light measuring circuit 30 is driven to measure light (step S6). Using a result of the light measurement the exposure calculation is carried out (step S7). Here, the set value (stop-down amount) of the diaphragm 2 and integral time of the image pick-up device 10 are found.

Then it is decided whether or not the 2RSW 34 is turned ON (step S8). If, in this decision, the 2RSW 34 is in the OFF state (NO), it is decided whether or not the 1RSW 33 remains in the ON state (step S9). If the 1RSW 33 remains in the ON state (YES), an intention to take a picture is assumed and a standby state is taken until the 2RSW 34 is turned ON. And, as in the case of steps Si and S2, the image pick-up device 10 is driven and image data is input to the image memory 38 (step S10). The image data is read out from the image memory 38 and displayed on the image monitor 13 (step S11). By repeating these steps S8→S9→S10→S11, the subject images are sequentially displayed as dynamic images on the image monitor 13.

If, at step S8 above, the 2RSW 34 is turned ON (YES), the diaphragm 2 is stopped down by the diaphragm drive mechanism 40 (step S12).

Thereafter, it is decided whether or not the image confirmation mode SW 32 is set to the confirmation mode (step S13).

If, in this decision, the image confirmation mode SW 32 is turned ON, that is, set to an image confirmation mode (YES), an exposure remains as it is (step S15). Since, in the image confirmation mode, the shot of a picture onto the film 5 and pick-up of the picture by the image pick-up device 10 are simultaneously effected, it is necessary that the shot of the picture be done with the pellicle mirror 3 set in a "down" state.

If, on the other hand, the image confirmation mode SW 32 is turned OFF, that is, set to the normal mode (NO), an ordinary film shot is involved and, after the pellicle mirror 3 has been set to the "up" state (step S14), the exposure (light exposure) is done at step S15.

If the pellicle mirror 3 as a half mirror is set in the "down" state, an amount of light incident on the film 5 is decreased to its half level and, with the pellicle mirror 3 set in the "up" state, a lowering in a substantial ISO sensitivity is prevented by effectively utilizing an amount of light incident on the film 5.

The exposure operation at step S15 will be explained below with reference to the flow chart shown in FIGS. 6A and 6B.

First, the running of the first curtain of the shutter 4 is started (step S41).

It is decided whether or not the image confirmation mode SW 32 is set to the image confirmation mode (step S42).

If, in this decision, it is set to the image confirmation mode (YES), then an exposure timer of the film is reset in accordance with the result of calculation at step S7 and started (step S43). Then the first curtain of the shutter is run and, by a first curtain full-opening detecting unit, not shown, mounted near the curtain, a detection is made as to whether or not the first curtain is fully opened (step S44). In this connection it is to be noted that, as another practical form, a count corresponding to a first curtain running time is set to the timer, without using the first curtain full-opening detecting unit, and the termination of the count is decided as the completion of the first curtain run and it may be possible, in this case, to go to the next step.

When, at step S44, a detection signal indicating the full opening of the first curtain is obtained (YES), the integration of the image pick-up device 10 is started (step S45). At the same time, an image pick-up device integration timer of the image pick-up device 4 is reset and started (step S46). As the setting time of this timer use is made of a result of the exposure calculation at step S7.

In the case of an underexposure, a flash unit is fired with the use of a flash unit firing circuit not shown (step S47). Thereafter, it is decided whether or not the starting film exposure timer reaches a "time is up" state (step S48) and, if the time is up (YES), the second curtain is started (step S49).

It is decided whether or not the image pick-up device integration timer starting at step S46 reaches the "time is up" state (step S50) and, if the time is up (YES), the integration of the image pick-up device 10 is terminated (step S51).

If, in the decision at step S48, the film exposure timer reaches no "time is up" state (NO), it is decided whether or not the image pick-up device integration timer reaches a "time is up" state (step S52). If, here, the image pick-up device integration timer reaches no "time is up" state (NO), control is returned back to step S48 and, again, it is decided whether or not the film exposure timer reaches a "time is up" state. This means that both the film exposure timer and image pick-up device integration timer are considered and, in accordance with the "time is up" state first reached by either one of them, the decision is made as to whether the integration of the image pick-up device 10 is completed or the second curtain is started.

If the image pick-up device integration timer reaches the "time is up" state (YES), the integration of the image pick-up device 10 is terminated (step S53).

Thereafter, it is decided whether or not the film exposure timer reaches the "time is up" state (step S54) and the second curtain is started (step S55).

If, at step S51, the integration of the image pick-up device 10 is terminated or, at step S55, the second curtain is started, the image data obtained by the image pick-up device 10 and A/D converted is temporarily stored in the image memory 38 (step S56).

And it is decided whether or not the running of the second curtain is completed by a second curtain run completion detection unit, not shown, mounted near the second curtain of the shutter 4 (step S57) and, if the running of the second curtain is completed, control is returned back.

If, on the other hand, in the decision of step S42 above, no image confirmation mode is set and the normal mode is involved (NO), then the exposure timer of the film is reset in accordance with the result of the exposure calculation at step S7 and started (step S58). Then, the second curtain of the shutter 4 is run and, by a second curtain full-opening detection unit, not shown, mounted near the second shutter, detection is made as to whether or not the second curtain is fully opened (step S59). This detection may be used, as in the above case, by the setting of a predetermined count to the timer in place of the second curtain full-opening detection unit.

When, at step S59, a detection signal representing the full opening of the first curtain is obtained (YES), a flash unit is fired, as the case may be, with the use of a flash unit firing circuit not shown (step S60).

Thereafter it is decided whether or not the starting film exposure timer reaches a "time is up" state (step S61). If the timer is up (YES), the second curtain is started (step S62) and, thereafter, control goes to step S57 above and the running of the second curtain is completed, control is returned.

Then a return to the main routine of FIG. 4 is effected.

After the exposure at step S15 above has been effected, it is again decided whether or not the image confirmation mode SW 32 is set to the image confirmation mode (step S16) and, if it is set to the image confirmation mode (NO), the pellicle mirror 3 set to the "up" state before exposure is set to a "down" state (step S17).

And the diaphragm 2 is opened by the diaphragm drive mechanism 40 (step S18) and a shot film 5 is wound up (step S19).

Then it is decided whether or not the image confirmation mode SW 32 is set to the image confirmation mode (step S20) and, if it is set to the image confirmation mode (YES), the image data at the time of taking a picture is read out from the image memory 38 and displayed on the image monitor 13 (step S21).

And the image data is displayed on the image monitor 13 and the timer is operated for a 5-second period (step S22). At the completion of the timer (step S23) the image taken at the picture-taking time disappears from its display and control is returned back to step S1 above and those images sequentially input onto the image pick-up device 10 are displayed as dynamic images.

Although, in the present embodiment, the image display is done just after the picture-taken film has been wound up, the present invention is of course not restricted thereto and such display may be arbitrarily done by operating an operation unit or may be done after all frames of the film have been shot.

According to the present embodiment, as set out above, it is possible to select the image confirmation mode capable of confirming an image taken onto the film and a not-confirmable normal film-shot mode in accordance with the luminance of a shot subject and hence to prevent the darkening of a subject image without involving a substantial lowering in the film speed (ISO) even in the case where the luminance of the subject is lower and also prevent camera shaking.

In order to impart a phase difference to image data taken by the picture-taking lens system 1 in front of the image pick-up device 1, the pupil-dividing LCD is arranged and, with the use of the image pick-up device arranged within the finder, it is possible to effect phase difference AF control. And the processing speed is fast in comparison with the contrast control and there is no increase in the area of the light receiving surface of the image pick-up device.

Further, it is not necessary to separately provide a light detection sensor for AF use and it is possible to secure a wider AF detection area at low costs and realize accurate AF control.

Figure 6A:
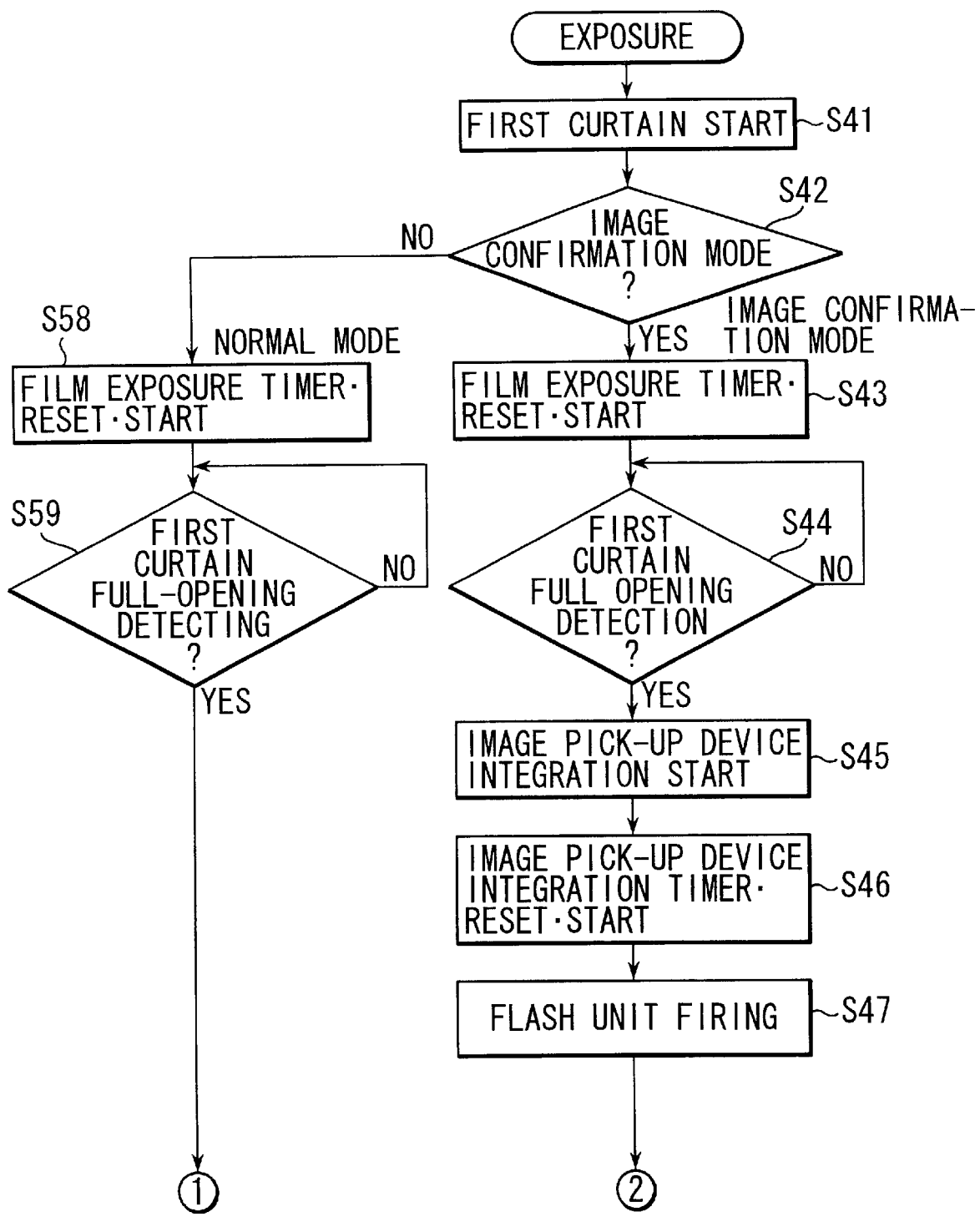
FIGS. 6A and 6B flow charts for explaining a sub-routine of a light exposure operation in FIG. 4.
Figure 6B:
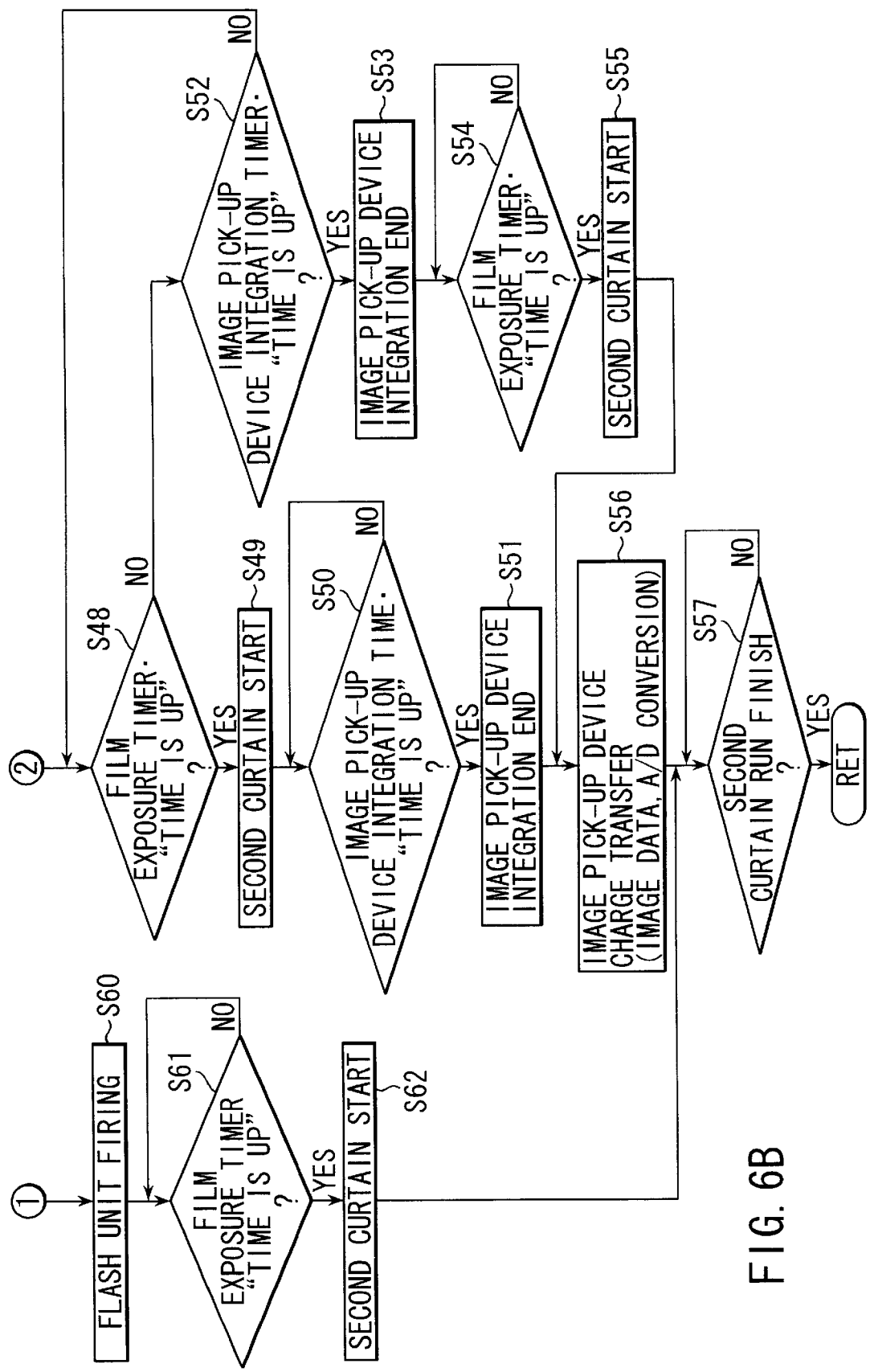

In the case where the subroutine for just-in-focus detection in FIGS. 6A and 6B is effected, if, at this time, the image data obtained from the picture-taking lens system 1 is simply taken onto the image pick-up device and displayed on the image monitor 13, then an image obtained is disturbed.

In connection with such a disturbance, an optical path with a subject image formed by the lens in a just in-focus state will be explained as a model in FIGS. 7A, 7B, 7C and 7D below.

Figures 7A, 7B, 7C, 7D:
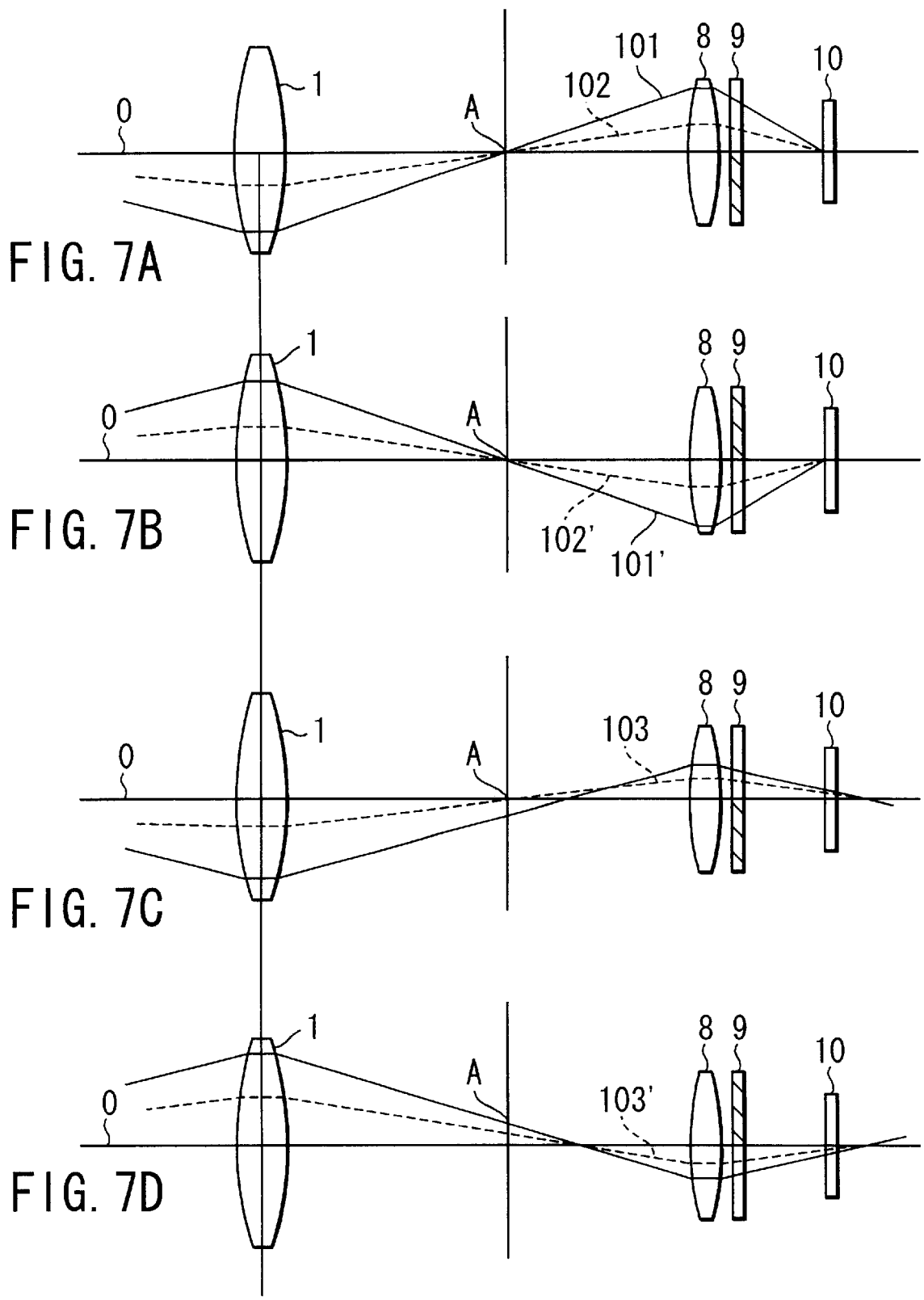
FIGS. 7A to 7D each are a view showing, as a model, an optical path in the case of just-in-focus states with a subject image imaged by a lens.

Although the pupil-dividing LCD 9 is shown with an upper half light-transmitted and lower half light-shielded, for convenience, in FIG. 7A, it is considered that, in the present embodiment, it is set with the right half light-transmitted and left half light-shielded as shown in FIG. 2A. It is to be noted that, although the transmitted light beam is elliptical in shape, one half is light-transmitted and one half is light-shielded for simplicity in explanation. An image formed by the picture-taking lens system 1 is incident on the relay lens 8 past a focus (a plane optically equivalent to the film surface: the setting position of the condenser lens 6) A. And it is transmitted through the upper half of the pupil-dividing LCD 9 from the relay lens 8 and, of those light beams issued from the optical axis position 0 of a subject image, the transmitted light beam passes between the optical axis o and a light beam 101 of the greatest angle from the optical axis 0 and its principal light beam position is located as a light beam 102.

In the case where, on the other hand, an imaged light beam passes through the lower half of the pupil-dividing LCD 9 as shown in FIG. 7B, the transmitted light beam of the light issued from the optical axis position O of the subject image passes between the optical axis O and a light beam 101' of the greatest angle from the optical axis O and its principal light beam is located as the light beam 102' and, on the optical position of the image pick-up device 10, a light beam issued from the same position of the subject image is incident.

This and that light beam issued from a position other than the optical axis of the subject form an image at the same position other than the optical axis of the image pick-up device 10.

In the just in-focus state as shown in FIGS. 7A and 7B, therefore, a coincidence occurs in the image data incident from the right and left sides of the relay lens 8 and, even if these image data are sequentially displayed on the image monitor 13, the disturbance of the image is not produced.

In the case of a not-focused state (out-of-focus state) as shown in FIGS. 7C and 7D, for example, in the case where focus is formed behind the image pick-up device, that is, a back focus is formed, respective principal light beams are located at 103 and 103' as shown in FIGS. 7C and 7D.

Therefore, those light beams issued from the optical axis position O of the subject image and passing through the right and left of the relay lens 8 are not imaged on the optical axis position of the image pick-up device 10 and are displaced at the right and left sides on the light receiving surface of the image pick-up device 10.

Therefore, in the case of being the not-focused state, if the respective image data are sequentially displayed on the image monitor, a corresponding image is oscillated side-to-side and becomes unsightly.

As a countermeasure against these, an image monitor display latch control section 39a is provided within the image monitor driver 39 in FIG. 3 so as to inhibit the rewriting of a currently displayed image on the image monitor 13 and hold the image display as it is.

When the AF control is effected by the image monitor display latch control section 39a, the image is inhibited from being rewritten, that is, when the light-transmission and light-shielding of the pupil-dividing LCD 9 are effected, the display of the image data read out from the image memory 38 immediately before the shielding of the light is held on the monitor 13 and, after the light shielding, the image data is replaced by the stored image data and, though the image temporarily becomes a still image, it is possible to prevent the display image from being disturbed.

Figure 8:
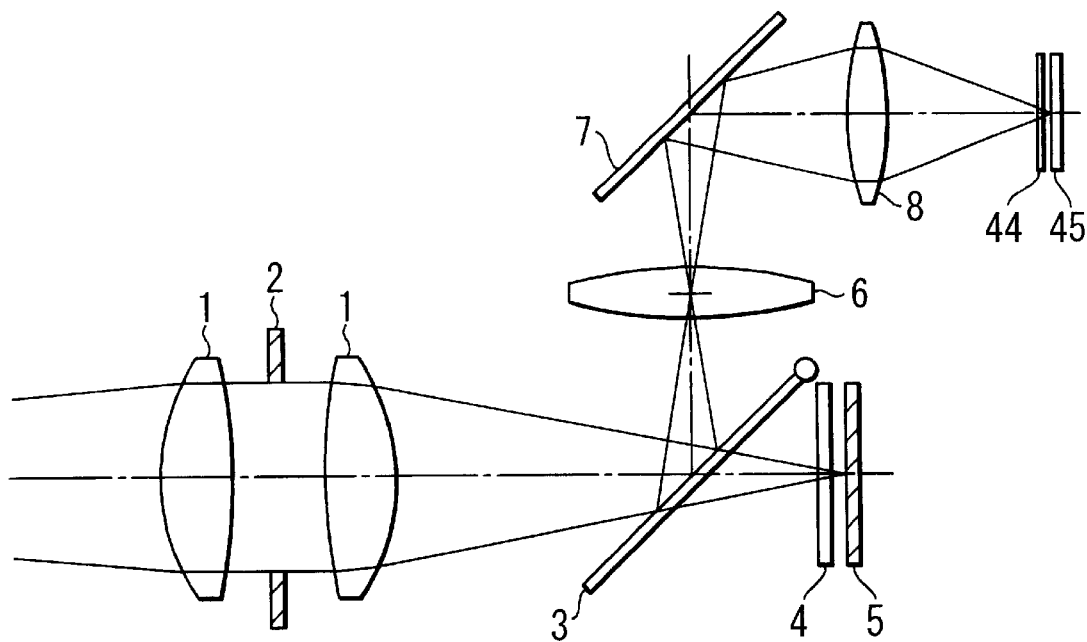
FIG. 8 is a view diagrammatically showing a practical form of an optical system of a camera according to a second embodiment.

FIG. 8 diagrammatically shows a practical example of an optical system of a camera according to a second embodiment of the present invention and an explanation will be made below about it.

This camera is different from the above-mentioned first embodiment in terms of the pupil-dividing LCD 9 used as a pupil-dividing means for detecting a phase difference and the image pick-up device 10. In this embodiment, the same reference numerals are employed to designate parts or elements corresponding to those shown in the first embodiment and any further explanation of them is, therefore, omitted.

In the present embodiment, as shown in FIG. 8, an optical system comprised of a fly eye lens 44 for detecting a phase difference and image pick-up device comprised of a photo-diode array 45 are arranged behind a relay lens 8. The fly eye lens 44 is comprised of many small convex lenses and these lenses are so arranged as to cover two photodiodes with one convex lens and to correspond to the array of the photo-diode.

Figure 9:
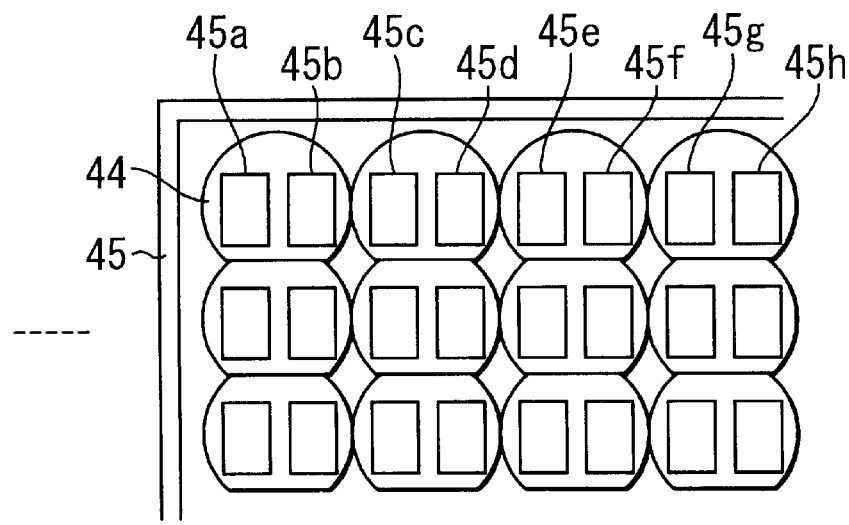
FIG. 9 is a view showing a planar structure of an optical system and image pick-up device in the second embodiment as viewed from a front side of an optical axis direction of the image pick-up device.
Figure 10:
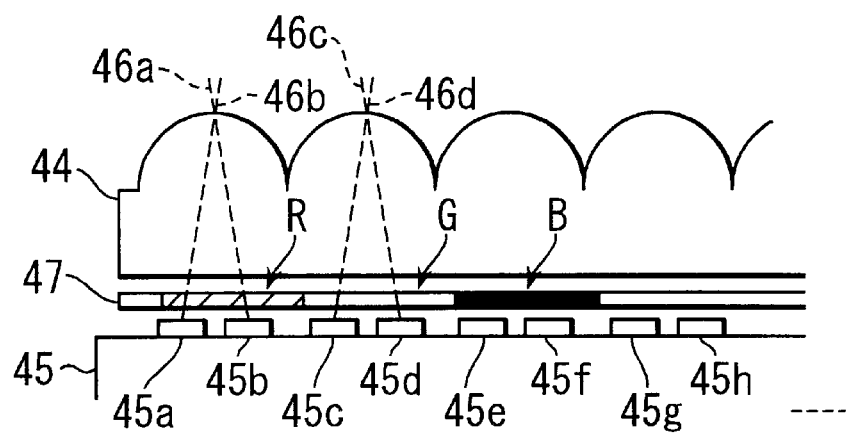
FIG. 10 is a view showing a cross-sectional view of a structure of an optical system and image pick-up device in the second embodiment.

FIG. 9 shows, in the arrangement of the optical system and image pick-up device, a planar structure as viewed from a front side of the optical axis direction of the image pick-up device and FIG. 10 shows its cross-sectional structure.

In this arrangement, the image pick-up device comprises a photodiode array 45 comprised of a matrix array of many photodiodes 45a to 45n.

Figure 11:
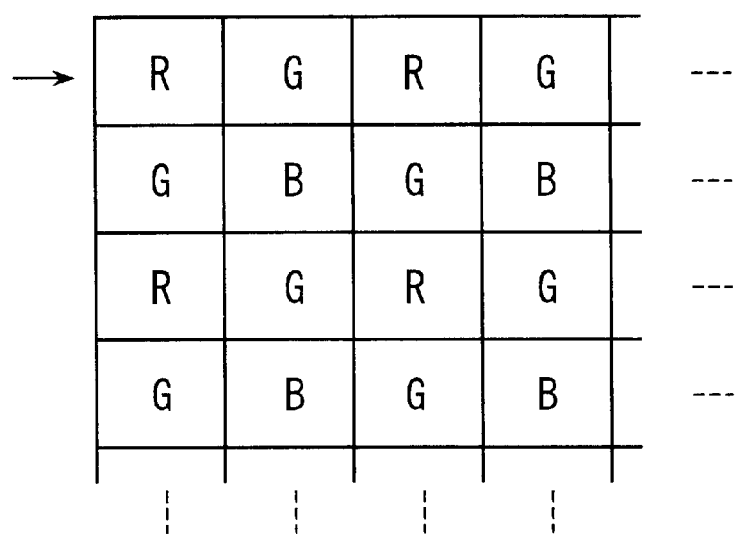
FIG. 11 is a view showing a color filter array in the second embodiment.

As shown in FIG. 10, the fly eye lens 44 is arranged above the photodiode array 45 with a color filter 47 set therebetween. This color filter 47 adopts the known Bayer array as shown in FIG. 11 and three kinds of color filters of R, G, B are arranged.

In FIG. 10, for example, convex lenses 44a and 44b are arranged above four photodiodes 45a, 45b, 45c, 45d. Those light beams condensed by the relay lens 8 are incident on the photodiodes 45a, 45b, 45c, 45d respectively past the optical paths 46a, 46b, 46c, 46d of the convex lenses 44a and 44b. of these light beams, the light beams passing through the right side of the relay lens 8 are incident on the photodiodes 45a, 45c past the optical paths 46b, 46c and, further, the light beams passing through the left side of the relay lens 8 are incident on the photodiodes 45b, 45d past the optical paths 46a, 46c.

The conical pattern of the light beam defined by the optical paths 46a, 46b are relatively related to the optical path of the relay lens 8 and, in an in-focus state, the photodiodes 45a, 45b and photodiodes 45c, 45d should receive all the same light amount.

In the case where a focus is not obtained on the light receiving surface of the photodiode array 45, the light beam comes from an optical path different from a heretofore passed path in the relay lens 8. The photodiodes 45a, 45b receive different light amounts. Looking at this from the image pattern of output signals of the photodiodes arranged on the right and left sides relative to the convex lens, a whole shift, that is, a phase difference, occurs.

This is described in more detail in JPN PAT APPLN KOKOKU PUBLICATION NO. 57-49841.

When, in the present embodiment, AF control is made under a condition that, for example, an uppermost filter array of R, G, R, G, . . . , in FIG. 11 is involved, use is made of only the photodiodes 45*a*, 45*e*, . . . below the color filter R and a phase difference detection is made from output image patterns. From the phase difference of these patterns a correlation calculation is carried out to find the defocus amount of the picture-taking lens system 1.

Further, in the case where image data is sent to the image monitor 13, addition is effected for the photodiodes 45*a*, 45*b* and photodiodes 45*c*, 45*d* arranged as a set below one convex lens, and image data is prepared by composed sensor outputs.

Figure 12:
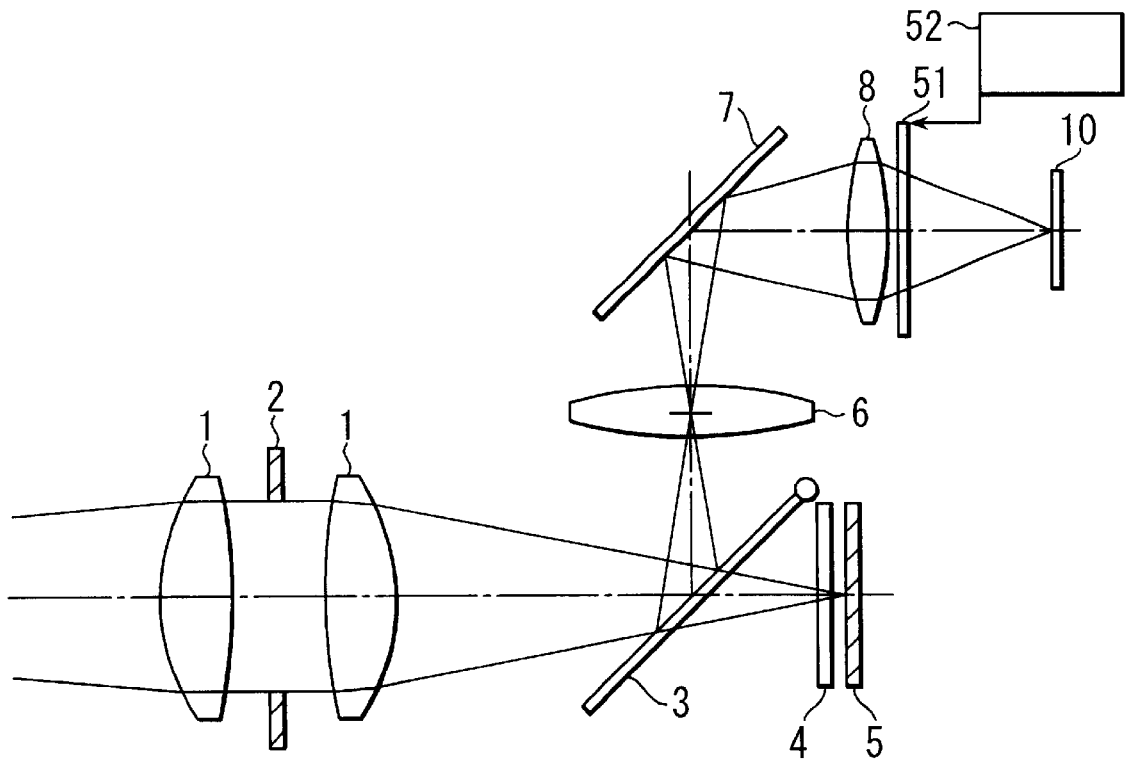
FIG. 12 is a view diagrammatically showing an optical system of a camera according to a third embodiment.

FIG. 12 diagrammatically shows a practical form of an optical system of a camera according to a third embodiment of the present invention and explanation of it will be given below.

Although, in the first embodiment, the pupil-dividing LCD 9 comprised of a liquid crystal shutter is used for pupil division, the camera of the third embodiment is adapted to effect a pupil division by a movable type shield plate. This is a difference between both the embodiments. In this embodiment, the same reference numerals are employed to designate parts or elements corresponding to those shown in the previous embodiment and an explanation of them is, therefore, omitted.

In the present embodiment, as shown in FIG. 12, the movable type shield plate 51 for pupil division is arranged behind a relay lens 8 and an image pick-up device 10, such a CCD, is arranged behind the shield plate 51.

The shield plate 51 is rotated by a drive section 52 such as a motor to shield one of the right and left sides of the relay lens 8 and detect a phase difference from respective image data. By doing so, the AF control is carried out.

FIG. 13A shows a state in which the left half of the relay lens 8 is shielded by the shield plate 51 and FIG. 13B shows a state in which the right half of the relay lens 8 is shielded by the shield plate 51.

Further, in the case where a taken image is displayed on a monitor display, the shield plate 51 is swung away from the relay lens 8 to allow a light beam which comes from the whole surface of the relay lens 8 to be received on the image pick-up device 10 as shown in FIG. 13C.

When, even in the present embodiment, AF control (focus detection) is effected as in the first embodiment, a disturbed image appears on the image monitor and, with the use of an image monitor display latch control unit 39*a*, the rewriting of the image is inhibited so as to hold an image just before the AF control.

FIGS. 14A and 14B diagrammatically show a practical form of an optical system of a camera according to a fourth embodiment of the present invention and an explanation of it will be given below.

Although, as shown in FIG. 14A, in the first embodiment, the pupil-dividing LCD and image pick-up device are used so as to effect the phase difference, the fourth embodiment is such that, in place of them, a relay lens 52 having two convex sections 52*a*, 52*b* and image pick-up devices 53*a*, 53*b* are arranged, the image pick-up devices being comprised of a CCD, etc., and being separated into two sections respectively corresponding to the convex sections of the relay lens 52. For the other equivalent structures, the same reference numerals are employed and any further explanation of them is, therefore, omitted.

FIG. 14B shows an arrangement showing a finder section of the feature of the present embodiment as viewed from above. A light beam reflected on a total reflection mirror 7 is divided by relay lenses 52*a*, 52*b* and these two light beams are imaged onto the image pick-up devices 53*a*, 53*b*.

In the present embodiment, correlation calculation is made on the phase difference between a pattern A of the image data obtained from the relay lens 52*a* and image pick-up device 53a and a pattern B on the image data obtained by the relay lens 52*b* and image pick-up device 53*b* and, by doing so, AF control is carried out.

In the case of displaying a picked-up image on the monitor, use is made of either one of image data of the image pick-up devices 53*a*, 53*b*.

According to the above-mentioned embodiment, there is provided a display monitor-equipped camera using a silver salt film and having an image pick-up device arranged in a finder so as to enable a taken image of a picture to be confirmed at a site or field just after taking a picture, whereby it is possible to, according to the luminance of a subject, select a shot of a picture in an image confirming mode in a way to set the pellicle mirror (half mirror), that is, a mirror arranged in front of a film, in a "down" state to allow its shot image to be confirmed and a shot of a picture in a normal mode in a way to set the pellicle mirror in an "up" state.

Further, in order to impart a phase difference to image data in front of the image pick-up device which is taken from the picture-taking lens, the camera has any of the pupil-dividing LCD, swingable light shield plate, fly eye lens with an array of many convex lenses or relay lens divided into a plurality of convex sections and, by doing so, can effect the AF control with the use of the image pick-up device arranged in the finder. This can be done at a fast processing speed as in the prior art when being compared with the contrast control and without increasing the area of the light receiving surface of the image pick-up device. Further it is not necessary to separately provide a light detection sensor and it is possible to secure a wider AF detection area at low costs and to realize accurate AF control.

According to the present invention, as set out in more detail, the image pick-up device and display monitor are provided so as to confirm a picture image, equivalent to that obtained at a film shot, just after a picture is taken. And an AF-controlled camera can be provided which, by utilizing the image pick-up device for AF control, can effect a phase difference detection over a wider area and obtain an accurate fast in-focus state without increasing the size of the image pick-up device. A camera can also be provided which can prevent a disturbance of a picture image displayed on the image monitor during the operation of the just-in-focus detecting means.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A camera capable of forming a subject image onto a film with a light exposure and having an image pick-up device for picking up the subject image, said camera comprising:

a picture-taking optical system for forming the subject image onto a film surface;

a reflection mirror for reflecting at least a portion of a light beam passing through the picture-taking optical system;

a re-imaging optical system for allowing the light beam which is reflected on the reflection mirror to be re-imaged on a light receiving area of the image pick-up device;

a liquid crystal shutter provided between the re-imaging optical system and the image pick-up device to allow the light beam which passes through the re-imaging optical system to be pupil-divided, the liquid crystal shutter having a first transmission state in which a light beam of a first area of the re-imaging optical system is transmitted and a second transmission state in which a light beam of a second area of the re-imaging optical system different from the first area is transmitted;

a liquid crystal control circuit for setting the liquid crystal shutter to the first transmission state and the second transmission state at different timings; and an electric circuit for outputting a signal relating to a focus state of the picture-taking optical system by a phase difference system based on an output of the image pick-up device in the first transmission state and an output of the image pick-up device in the second transmission state.

2. A camera according to claim 1, wherein the liquid crystal shutter has a third transmission state in which all of the light beam passing through the re-imaging optical system is guided to the image pick-up device and, in the third transmission state, the electric circuit outputs image data corresponding to the subject image formed onto the film by the light exposure.

3. A camera according to claim 1, wherein the camera includes an electronic view finder for displaying the image data obtained at a time of the third transmission state.

4. A camera capable of forming a subject image onto a film with a light exposure and having an image pick-up device for picking up the subject image, said camera comprising:

a picture-taking optical system for forming the subject image onto a film surface;

a reflection mirror for reflecting at least a portion of a subject light beam passing through the picture-taking optical system;

a re-imaging optical system for allowing the subject light beam portion which is reflected on the reflection mirror to be re-imaged onto a light receiving area of the image pick-up device;

a liquid crystal shutter provided between the re-imaging optical system and the image pick-up device to allow the subject light beam which passes through the re-imaging optical system to be pupil-divided; and an electric circuit for outputting a signal relating to a focus state of the picture-taking optical system by a phase difference system based on an output of a light receiving area of the image pick-up device at which the subject light beam divided by the liquid crystal shutter is re-imaged.

5. A camera according to claim 4, wherein the liquid crystal shutter allows all of the subject light beam which passes through the re-imaging optical system to be guided to the image pick-up device in a fully transmissive state.

6. A camera according to claim 5, wherein the camera includes an electronic view finder for displaying image data.

7. A camera according to claim 4, wherein the liquid crystal shutter allows light beams which pass through two different areas of the re-imaging optical system to be guided to the image pick-up device at different timings and the electric circuit effects focus detection by a phase difference system based on respective outputs of the image pick-up device corresponding to the different light beams.

8. A camera according to claim 4, wherein the liquid crystal shutter has a first state in which a light beam of a left side of the re-imaging optical system passes and a second state in which a light beam of a right side of the re-imaging optical system passes and the electric circuit effects focus detection by a phase difference system based on respective outputs of the image pick-up device in the first and second states.

9. A camera comprising:

a picture-taking optical system for forming a subject image on a film surface;

image pick-up means having a light receiving element area provided for obtaining image data corresponding to the subject image;

an-image pick-up optical system for guiding a portion of a light beam of the picture-taking optical system to the image pick-up means;

pupil-dividing means provided in the image pick-up optical system;

just-in-focus state detecting means for detecting a just-in-focus state of the picture-taking optical system based on an output of the image pick-up means at a time when a light beam divided by the pupil-dividing means is received on the light receiving element area; and display means for displaying the subject image based on the image data obtained from the image pick-up means.

10. A camera comprising:

a picture-taking optical system for forming a subject image on a film surface;

image pick-up means having a light receiving element area provided for obtaining image data corresponding to the subject image;

an image pick-up optical system for guiding a portion of a light beam of the picture-taking optical system to the image pick-up means;

pupil-dividing means provided in the image pick-up optical system; and just-in-focus state detecting means for detecting a just-in-focus state of the picture-taking optical system based on an output of the image pick-up means at a time when a light beam divided by the pupil-dividing means is received on the light receiving element area;

wherein the pupil-dividing means comprises mask means for selectively setting a portion of a light beam of the image pick-up optical system to a light transmissive state or a light shielding state.

11. A camera having a picture-taking mechanism for forming a subject image which is imaged by a picture-taking optical system onto a film surface with a light exposure and display means for receiving the subject image on an image pick-up means and for sequentially displaying subject images on an image monitor based on outputs of the image pick-up means, wherein just-in-focus detection means is provided for detecting a just-in-focus state of the image pick-up optical state based on the outputs of the image pick-up means, and wherein the display means inhibits the subject images from being sequentially displayed on the image monitor during an operation of the just-in focus state detecting means and displays the subject image based on image data obtained before the operation of the just-in-focus detecting means.

12. A camera comprising:
    a picture-taking optical system forming a subject image onto a film surface;
    image pick-up means having a light receiving element area provided for receiving the subject image so as to obtain image data corresponding to the subject image;
    memory means for sequentially storing the image data;
    an image monitor for sequentially displaying subject images based on the image data stored in the memory means;
    an image pick-up optical system for guiding a portion of a light beam of the picture-taking optical system to the image pick-up means;
    pupil-dividing means provided in the image pick-up optical system;
    just-in-focus state detection means for detecting a just-in-focus state of the picture-taking optical system based on an output of the image pick-up means at a time when the light beam divided by the pupil-dividing means is received on the light receiving element area; and
    image monitor display latch means for inhibiting the subject images from being sequentially displayed on the image monitor during an operation of the just-in-focus state detection means and displaying the subject image based on the image data obtained from the operation of the just-in-focus state detection means.

13. A camera according to claim 12, wherein the pupil-dividing means comprises a mask means for setting a portion of a light beam of the image pick-up optical system selectively to a light transmissive state or a light shielding state.

14. A camera having a picture-taking optical system for forming a subject image onto a film surface and an electronic view finder device for monitoring the subject image with the use of a portion of a picture-taking light beam of the picture-taking optical system, said camera comprising:
    pupil-dividing means provided within the electronic view finder device; and
    an image pick-up device provided within the electronic view finder and arranged behind the pupil-dividing means,
    wherein the image pick-up device has both a function of monitoring the subject image and a function of detecting a just in-focus state of the image-taking optical system.

15. A camera comprising:
    an image-taking optical system for forming a subject image onto a film surface;
    an image pick-up means having a light receiving element area provided for obtaining image data corresponding to the subject image;
    an image pick-up optical system for guiding a portion of a light beam of the image-taking optical system to the image pick-up means;
    pupil-dividing means provided in the image-taking optical system; and
    just-in-focus state detecting means for detecting a just-in-focus state of the image-taking optical system based on an output of the image pick-up means at a time when a light beam divided by the pupil-dividing means is received by the light receiving element area;
    wherein the pupil-dividing means comprises mask means for setting a portion of a light beam of the image pick-up optical system selectively to a light transmissive state or a light shielding state.

16. A camera according to claim 15, wherein the mask means comprises a liquid crystal display device.

17. A camera according to claim 15, wherein the mask means comprises a shield plate and drive means for driving the shield plate.

18. A camera comprising:
    an image-taking optical system for forming a subject image onto a film surface;
    an image pick-up means having a light receiving element area provided for obtaining image data corresponding to the subject image;
    an image pick-up optical system for guiding a portion of a light beam of the image-taking optical system to the image pick-up means;
    pupil-dividing means provided in the image-taking optical system; and
    just-in-focus state detecting means for detecting a just-in-focus state of the image-taking optical system based on an output of the image pick-up means at a time when a light beam divided by the pupil-dividing means is received by the light receiving element area;
    wherein the pupil-dividing means comprises a fly eye lens.

19. A camera comprising:
    a picture-taking optical system forming a subject image onto a film surface;
    image pick-up means having a light receiving element area provided for receiving the subject image so as to obtain image data corresponding to the subject image;
    memory means for sequentially storing the image data;
    an image monitor for sequentially displaying subject images based on the image data stored in the memory means;
    an image pick-up optical system for guiding a portion of a light beam of the picture-taking optical system to the image pick-up means;
    pupil-dividing means provided in the image pick-up optical system;
    just-in-focus state detection means for detecting a just-in-focus state of the picture-taking optical system based on an output of the image pick-up means at a time when the light beam divided by the pupil-divided means is received on the light receiving element area; and
    image monitor display latch means for inhibiting the subject images from being sequentially displayed on the image monitor during an operation of the just-in-focus state detection means.

20. A camera according to claim 19, wherein the just-in-focus state detection means detects a just-in-focus state of the picture-taking optical system based on a phase difference of output signals of at least two different portions of the light receiving element area.

21. A camera according to claim 19, wherein the pupil-dividing means comprises a mask means for setting a portion of a light beam of the image pick-up optical system selectively to a light transmissive state or a light shielding state.

22. A camera according to claim 21, wherein the mask means comprises a liquid crystal display device.

23. A camera according to claim 21, wherein the mask means comprises a shield plate and drive means for driving the shield plate.

24. A camera comprising:
- a picture-taking optical system for forming a subject image on a film surface;
- image pick-up means having a light receiving element area provided for receiving the subject image so as to obtain image data corresponding to the subject image;
- memory means for storing the image data;
- an image monitor for displaying the subject image based on the image data stored in the memory means;
- display repetition performing means for repetitively performing display of the subject image on the image monitor;
- image pick-up optical system for guiding a portion of a light beam of the picture-taking optical system to the image pick-up means;
- pupil-dividing means provided in the image pick-up optical system;
- just-in-focus state detection means for detecting a just-in-focus state of the picture-taking optical system based on an output of the image pick-up means at a time when a light beam divided by the pupil-dividing means is received on the light receiving element area; and
- image monitor display latch means for displaying the subject image based on the image data obtained during operation of the display repetition performing means at a time when the just-in-focus state detection means is operated during the operation of the display repetition performing means.

* * * * *